(12) United States Patent
Saramäki et al.

(10) Patent No.: US 6,370,556 B1
(45) Date of Patent: *Apr. 9, 2002

(54) METHOD AND ARRANGEMENT IN A TRANSPOSED DIGITAL FIR FILTER FOR MULTIPLYING A BINARY INPUT SIGNAL WITH TAP COEFFICIENTS AND A METHOD FOR DESIGNING A TRANSPOSED DIGITAL FILTER

(75) Inventors: Tapio Saramäki, Pirkkala; Tapani Ritoniemi; Ville Eerola, both of Tampere; Timo Husu, Joensuu; Eero Pajarre; Seppo Ingalsuo, both of Tampere, all of (FI)

(73) Assignee: Tritech Microelectronics, Ltd, Singapore (SG)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/522,362

(22) PCT Filed: Mar. 31, 1994

(86) PCT No.: PCT/FI94/00126

§ 371 Date: Sep. 27, 1995

§ 102(e) Date: Sep. 27, 1995

(87) PCT Pub. No.: WO94/23493

PCT Pub. Date: Oct. 13, 1994

(30) Foreign Application Priority Data

Apr. 5, 1993 (FI) .................................................. 931532

(51) Int. Cl.$^7$ .............................................. G06F 17/16
(52) U.S. Cl. ........................................ 708/319; 708/603
(58) Field of Search ........................ 364/724.16, 724.17; 708/319, 320, 603

(56) References Cited

U.S. PATENT DOCUMENTS

| | | | | |
|---|---|---|---|---|
| 3,696,235 A | * | 10/1972 | Tufts et al. ............. | 364/724.01 |
| 4,430,721 A | * | 2/1984 | Acampora ............. | 364/724.16 |
| 4,791,597 A | * | 12/1988 | Miron .................... | 364/724.03 |
| 4,811,259 A | * | 3/1989 | Costas ................... | 364/724.16 |
| 4,835,725 A | * | 5/1989 | Yassaie ................. | 364/724.16 |
| 4,982,354 A | * | 1/1991 | Takeuchi et al. ....... | 364/724.16 |
| 5,025,406 A | * | 6/1991 | Klank et al. ........... | 364/724.19 |
| 5,243,552 A | * | 9/1993 | Asakura ................ | 364/724.16 |

\* cited by examiner

*Primary Examiner*—David H. Malzahn
(74) *Attorney, Agent, or Firm*—George O. Saile; Stephen B. Ackerman; Billy Knowles

(57) ABSTRACT

The invention relates to a method and an arrangement in a transposed digital FIR filter for multiplying a binary input signal by tap coefficients, and to a method for designing such a filter. The invention comprises a shift register (51, 52) shifting in the direction of the least significant bit and copying the most significant bit or filling in zero values. The register receives the binary input signal of the filter and has outputs for outputting the content of the desired bit positions. A plurality of bit-serial subtractor and adder elements (53–57) multiply the binary input signal by N+1 different tap coefficients by combining output bits of the shift register (51, 52). The subtractor and/or adder elements form a network wherein at least one element participates in the multiplying operation of at least two different tap coefficients.

13 Claims, 4 Drawing Sheets

Figure 4:
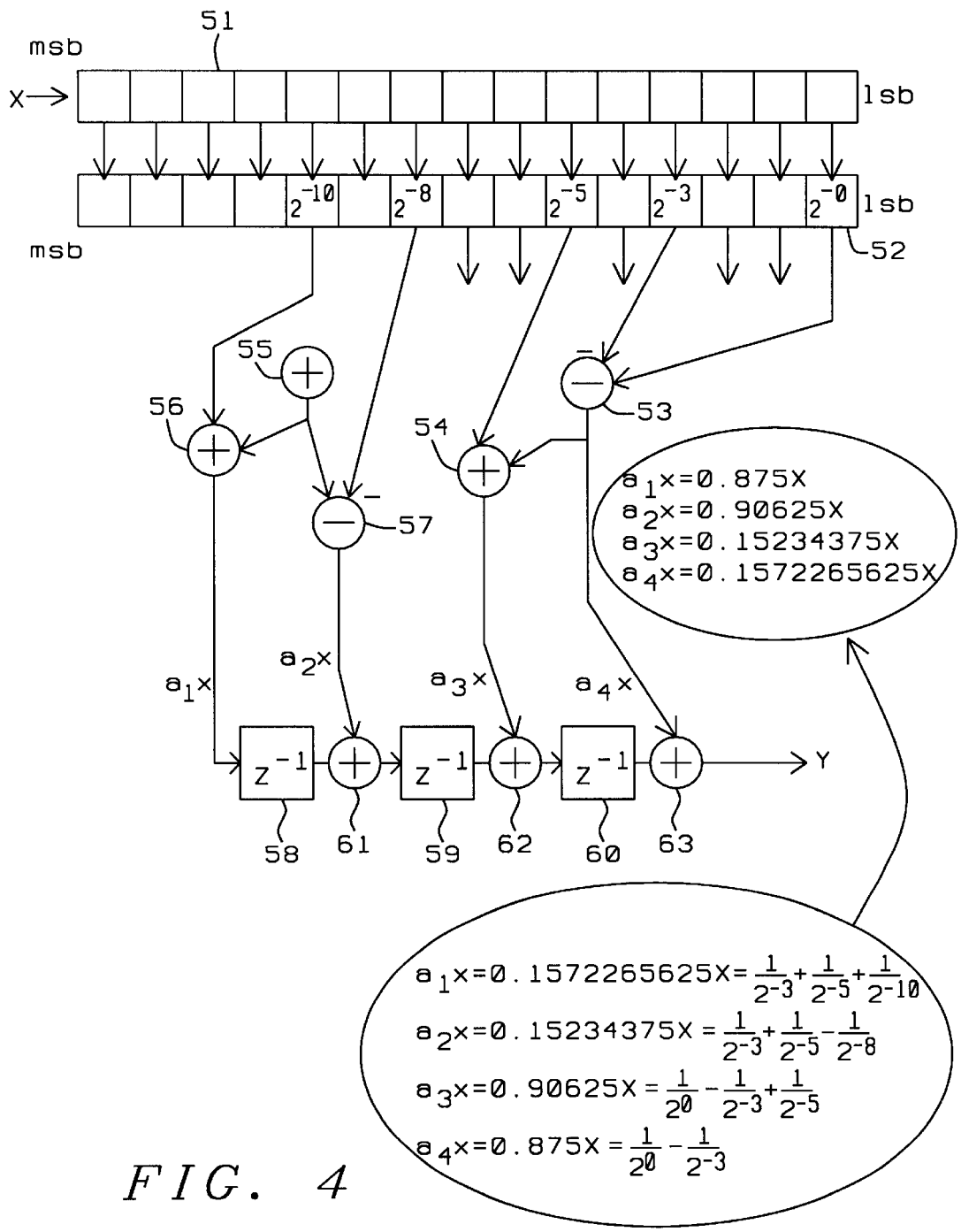

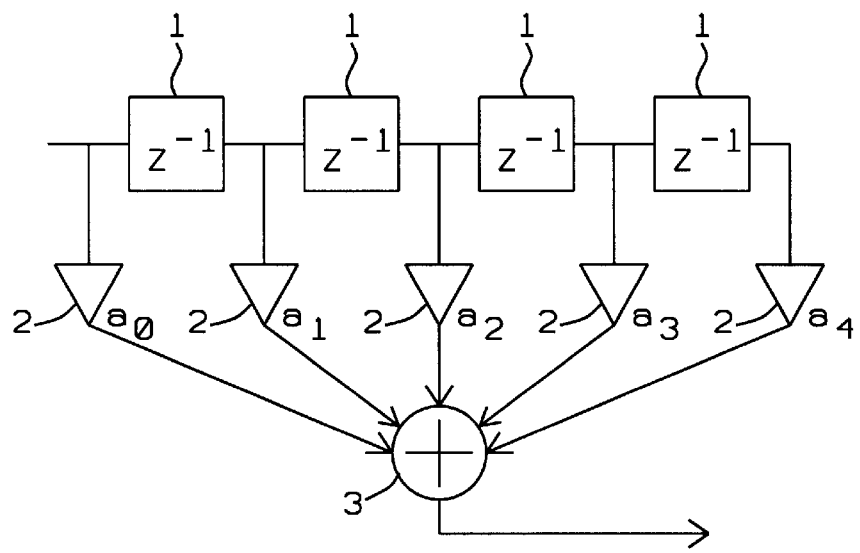
*FIG. 1 — Prior Art*
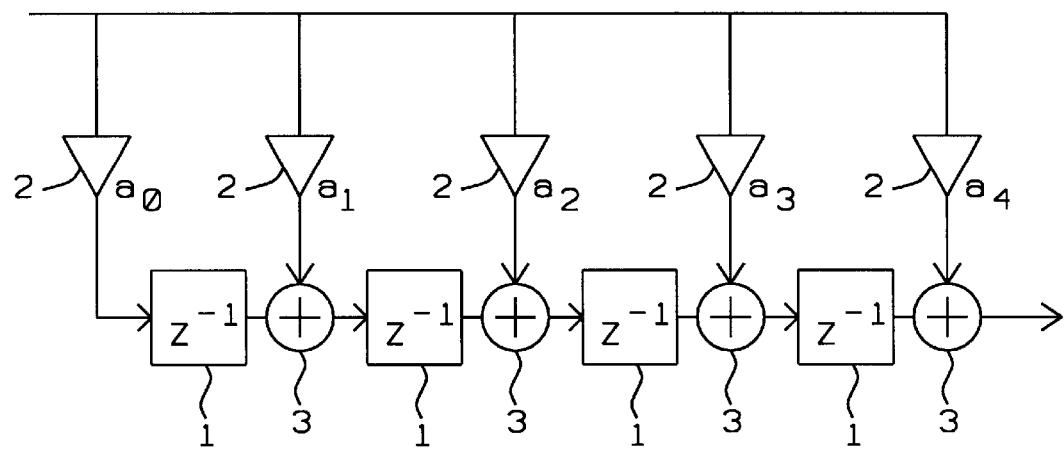
*FIG. 2 — Prior Art*

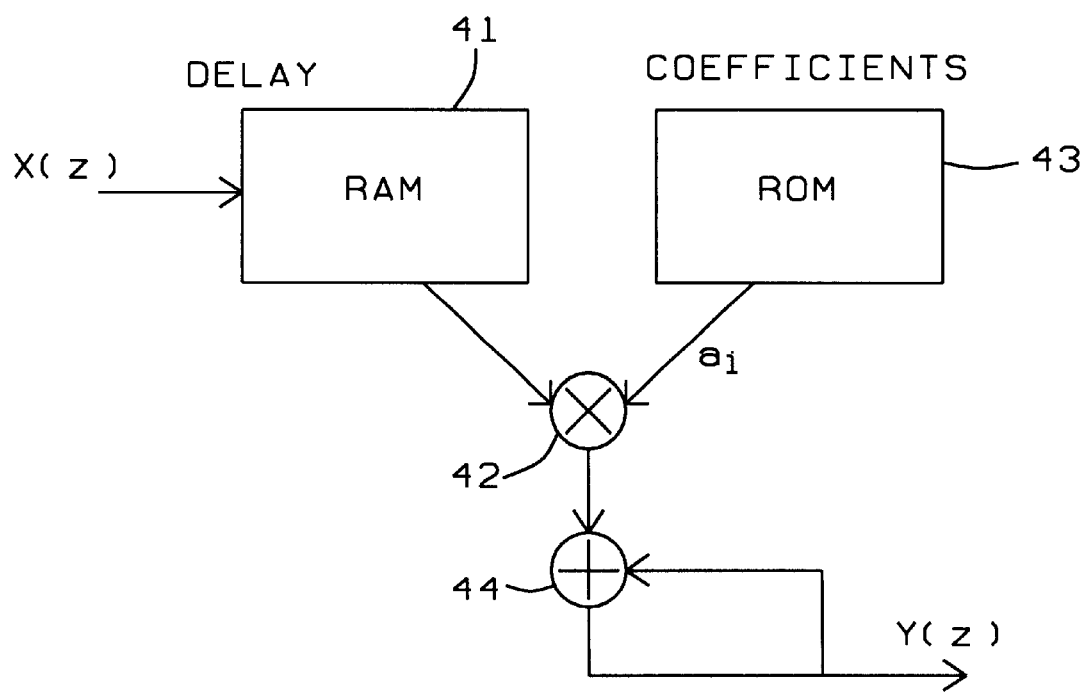
FIG. 3 – Prior Art

METHOD AND ARRANGEMENT IN A TRANSPOSED DIGITAL FIR FILTER FOR MULTIPLYING A BINARY INPUT SIGNAL WITH TAP COEFFICIENTS AND A METHOD FOR DESIGNING A TRANSPOSED DIGITAL FILTER

The invention relates to a method and an arrangement in a transposed digital FIR filter for multiplying a binary input signal by tap coefficients and to a method for designing such a filter.

A digital filter is a software or a specially designed electronic circuit processing discrete signal samples to perform a desired transfer function operation on said signal. The Z transfer function of a digital, i.e. discrete time FIR (Finite Impulse Response) filter has the generic form $$H(z) = \frac{Y(z)}{X(z)} = \sum_{i=0}^{N} a_i \times z^{-i} \quad (1)$$

where $H(z)$ is the transfer function of the filter, $Y(z)$ and $X(z)$ represent the output and input of the filter respectively, $a_i$ represent constant coefficients, i.e. tap coefficients, and $z^{-i}$ represents a delay of i clock cycles. The properties of a FIR filter are solely dependent on the tap coefficients $a_1$, and thus synthesizing a discrete time filter calls for determining these coefficients so as to provide a filter having the desired characteristics. There are several methods for determining the coefficients. The non-recursive discrete time filter in accordance with equation (1) is normally represented as a block diagram as shown in FIGS. 1 and 2. FIG. 1 illustrates a so-called direct-type FIR (Finite Impulse Response) filter and FIG. 2 a transposed FIR filter. The filtering function in accordance with equation (1) can be realized by both discrete time filters, but the present invention relates to a transposed FIR filter according to FIG. 2. As is apparent from FIGS. 1 and 2, the discrete time filter is illustrated as a block diagram wherein square blocks 1 perform delaying of the information by one clock cycle $z^{-1}$, triangular blocks 2 represent multiplying operations and circles 3 represent adders.

As stated previously, the characteristics of the filter are dependent on the values of the tap coefficients $a_i$. In certain prior art transposed FIR filters, a discrete multiplier unit for each tap coefficient is employed. The drawback of this arrangement is the large number of multiplier units required, which occupy a considerable area on a chip when realized as an integrated circuit and are therefore costly. One known implementation is such wherein the tap coefficients are simple sums of powers of two, i.e. the coefficients are limited to the form $2^{-a}+2^{-b}+2^{-c}$. Such a solution is attended by the drawback of limitations in the possible coefficients to be realized. These limitations can substantially complicate the realization of the desired signal processing function $H(z)$.

Still another known solution entails the use of a fast multiplier and memory for realizing the filter. Such a solution is illustrated in FIG. 3, wherein the necessary delays $z^{-1}$ are generated by buffering the values of the input signal $X(z)$ into a RAM memory 41 prior to their application to a multiplier 42, where they are multiplied by existing coefficients $a_i$ obtained from a ROM memory. Thereafter the multiplication results are applied to an adder 44 wherein they are summed together with the filter output $Y(z)$. The drawback of such a solution is the chip area occupied by the fast multiplier unit 42. Further drawbacks include the power consumption of the multiplier unit 42 and, in certain applications, the electromagnetic interference produced thereby in other circuit structures. Furthermore, on account of the limited speed of the multiplier unit, only a limited number of coefficients $a_i$ can be realized with one multiplier unit. Complex structures require several multiplier units and complex control logic.

The object of the present invention is a transposed digital FIR filter that can be realized as an integrated circuit with several coefficients so as to occupy a substantially smaller chip area in integrated circuit configuration than that occupied in the prior art techniques.

Another object of the present invention is a filter structure suitable for comparatively high clock frequencies, since the speed of the filter structure is not dependent on the requisite number of coefficients.

A further object of the present invention is a digital filter enabling realization of arbitrary coefficients automatically.

These and other objects and advantages of the invention are achieved with a method in a transposed digital FIR filter for multiplying a binary input signal by tap coefficients, which method is characterized in accordance with the invention in that multiplications are performed by using a network of subtractor and/or adder elements wherein at least one element participates in multiplying by at least two different tap coefficients.

Another aspect of the invention is an arrangement in a transposed digital FIR filter for multiplying a binary input signal by tap coefficients. The arrangement is characterized in accordance with the invention in that it comprises a shift register shifting in the direction of the least significant bit and copying the most significant bit or filling in zero values. The register receives the binary input signal of the filter and has outputs for outputting the content of the desired bit positions, a plurality of bit-serial subtractor and adder elements for multiplying the binary input signal by N+1 different tap coefficients by combining output bits of the shift register. The subtractor and/or adder elements are configured as a network wherein at least one subtractor and/or adder element participates in the multiplying operation of at least two different tap coefficients.

One aspect of the invention is a method for designing a transposed digital filter. This method is characterized in accordance with the invention by determining the tap coefficients required in the filter and designing for the filter a network of subtractor and/or adder elements performing the multiplication by tap coefficients, wherein the number of elements is minimized taking into account certain performance criteria for the filter, so that a maximum number of elements participate in the multiplying operation of more than one different tap coefficients.

In the present invention, the tap coefficients are realized by combining numbers divided by powers of two with bit-serial adder and/or subtractor elements, so that at least some of the adder and/or subtractor elements are used for realizing more than one coefficient. In accordance with the invention, all necessary values multiplied by numbers of the form $2^{-n}$ are obtained simultaneously from one shift register. In other words, the "partial sum" or "partial difference" produced by a specific element can be used on the next level of the network of adder and/or subtractor elements simultaneously to form several coefficients. Further, in the arrangement according to the invention the combined use of adder and subtractor elements in producing the coefficients enables the number of elements (+/− operators) to be minimized. It is further possible to minimize the rounding error related to the coefficients by "balancing" the operators against each other.

By means of the invention, the network of bit-serial adder and subtractor elements can be optimized by finding the sum and/or difference of powers of two for the coefficients required, so as to considerably diminish the requisite number of calculation elements in comparison with the prior art solutions. For instance, if a coefficient accuracy of 20 bits is required, ten adder stages on an average are needed for each coefficient in the prior art implementation. With a design according to the invention, it is possible to realize the coefficients with three adder and/or subtractor stages for each coefficient. At the same time, the number of series-connected elements required is characteristically diminished. With the construction of the invention, arbitrary coefficients can be realized. A still another advantage of the invention is a low number of logic levels, and thus the maximum operating frequency is very high. When the invention is realized as an integrated circuit, the silicon area occupation required is less than half the area required by the filter shown in FIG. 3 which includes a multiplier and RAM and ROM memories.

Figure 5:
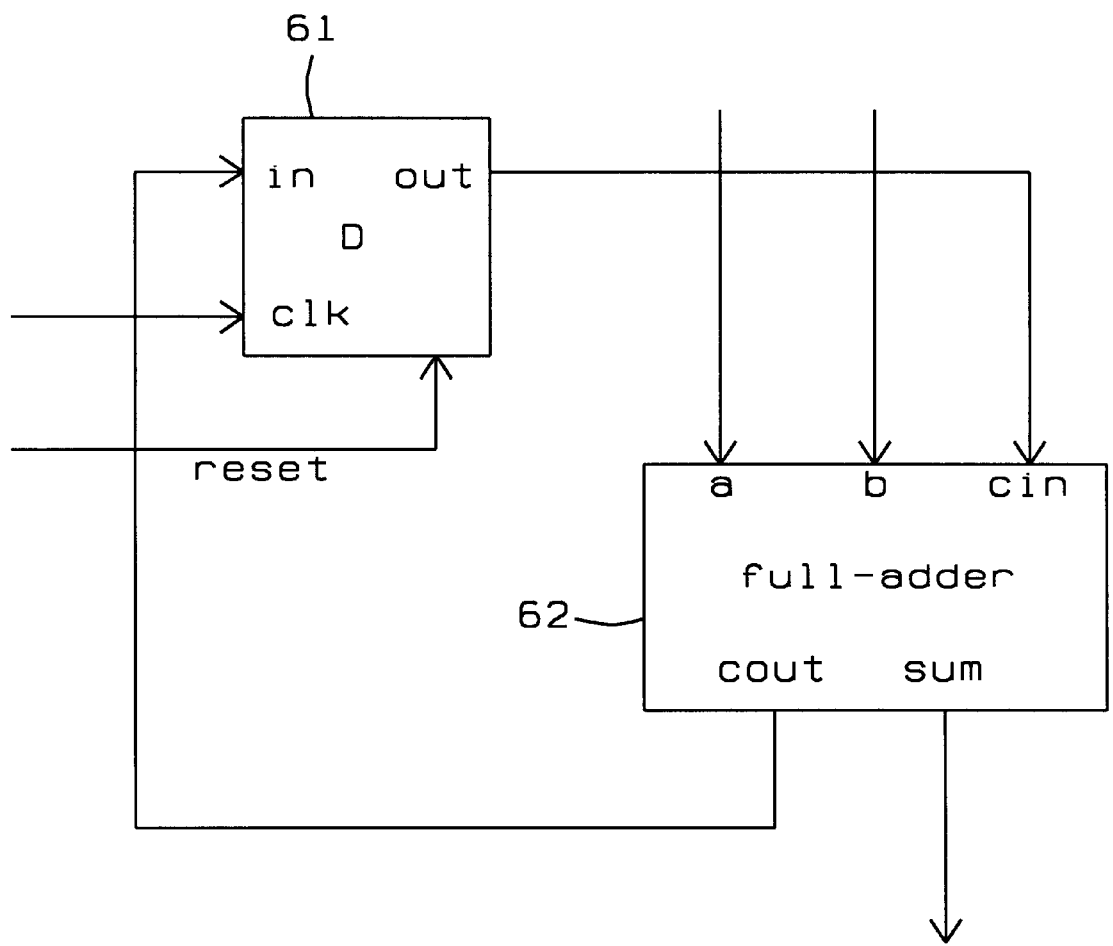

In the following the invention will be set forth by means of illustrating embodiments with reference to the accompanying drawing, wherein FIG. 1 is a block diagram of a direct-type digital FIR filter, FIG. 2 is a block diagram of a transposed digital FIR filter, FIG. 3 is a block diagram of a prior art digital filter implemented with a fast multiplier and memories, FIG. 4 is a block diagram of a digital filter of the invention with four coefficients, and FIG. 5 is a block diagram of a bit-serial adder element.

Reference will now be made to FIG. 4, showing a four-coefficient transposed digital FIR filter realized in accordance with the invention. The filter comprises a series connection of three filtering stages, each filtering stage comprising a delay block 58, 59 and 60 having a length of one word ($z^{-1}$) and an adder element 61, 62 and 63 connected thereafter, the output signal of each delay block being applied to the corresponding adder element and the output signal of each adder element being applied to the next delay block. The output of the last adder element 63 constitutes the output Y of the entire filter.

The binary input signal X of the filter is first applied in serial form to a serial/parallel converter 51 wherefrom it is copied into a series-type shift register 52. The number copied into the shift register 52 can be shifted bit by bit in the direction of the least significant bit LSB. Upon this, the shift register 52 adds X most significant bit MSB of the number copied into the shift register to the most significant end MSB of the shift register if the number X is in the 2's complement form. Otherwise, zeros are filled in as the most significant bits.

The shift register 52 has outputs for outputting the content of all bit positions or the desired bit positions.

A network of combining elements is coupled between the selected outputs of the shift register 52 and series-connected filtering stages 58–63 for multiplying the input signal X by tap coefficients $a_1$, $a_2$, $a_3$ and $a_4$ of the filter by combining output bits of the shift register 52, i.e. powers of two. The network comprises bit-serial adder and subtractor elements employing bit-serial arithmetic and being arranged in several levels. In accordance with the basic concept of the invention, it has been sought to minimize the number of calculation elements taking into account certain performance criteria for the filter, so that the same calculation elements are employed to produce more than one different tap coefficients. In the exemplary case of FIG. 4, four coefficients are formed employing only five bit-serial arithmetic elements 53, 54, 55, 56 and 57. For instance, the inputs of the subtractor element 53 are provided by bit position outputs $2^{-0}$ and $2^{-3}$ of the shift register. On the one hand, the output value X-(X/8) of the subtractor element 53 directly provides one of the output values $a_4x$ of the entire network, and this value is applied to the adder element 63 to be summed together with the output of the delay block 60, and on the other hand it forms an intermediate result that is applied as another input to the adder element 54. The other input of the adder element 54 is provided by bit position output $2^{-5}$ of the shift register 52, and the output of the element 54 constitutes one output value $a_3x$ for the entire network, said value being applied to the adder element 62 to be summed together with the output of the delay block 59. The inputs of the adder element 55 are provided by bit position outputs $2^{-3}$ and $2^{-5}$ of the shift register 52. The adder element 55 forms a subtotal that is applied to both the adder element 56 and the subtractor element 57. The other input of the adder element 56 is provided by bit position $2^{-10}$ of the shift register 52, and the output of the element 56 constitutes one output $a_1x$ for the entire network, said value being applied to the first delay block 58 connected in series. The other input of the subtractor element 57 is provided by bit position output $2^{-8}$ of the shift register 52, and the output of the element 57 constitutes one output $a_2x$ for the entire network, said value being applied to the adder element 61 to be summed together with the output of the delay block 58. Thus in the filter of FIG. 4 the element 53 participates in the calculation of both coefficient $a_3$ and coefficient $a_4$. Likewise, the adder element 55 participates in producing both coefficient $a_1$ and coefficient $a_2$.

The filter according to FIG. 4 operates in the following way. The first binary number of the discrete time signal of the filter is initially applied to the serial/parallel converter 51 wherefrom it is copied into the series-type shift register 52 in such a way that the least significant bit of the number X is positioned at bit position $2^{-0}$ of the register 52. The serial/parallel converter 51 and the shift register 52 thus constitute a kind of dual shift register wherein the serial/parallel converter 51 serves as a buffer into which the signal from the preceding signal processing stage can be received whilst the number in the shift register 52 is being processed by the filter of the invention. When the number X has been loaded into the shift register 52, the first calculation is performed, as a result of which the least significant bit of number Y is obtained at the filter output. Thereafter the number X is shifted in the shift register 52 one bit position to the right, i.e. in the direction of the least significant bit LSB, and a new calculation is performed to provide the next more significant bit of the number Y at the filter output. The rightward shifts in the shift register 52 and the resultant calculations are continued, providing further bits in the number Y at the filter output, until the desired accuracy has been achieved. Thereafter the next number is loaded from the serial/parallel converter 51 into the shift register 52.

FIG. 5 shows a block diagram of a bit-serial adder element. The adder element comprises a one-bit delay element 61, which in this exemplary case is realized by means of a D flip-flop, and an adder 62 adding two data bits together and outputting a sum and a carry bit $c_{out}$. All signals shown in FIG. 5 are one-bit signals, i.e. each of them can be realized by means of a single signal line.

The adder element shown in FIG. 5 operates in the following way. The numbers to be summed together are applied to the adder 62 in serial form, the least significant bit (LSB) being the first. The addition of two bits a and b and a carry bit $c_{in}$ gives as a result one sum bit sum and a carry bit $c_{out}$ which is stored in the delay element 61 for summing together the next bits. The delay element 61 is reset between the addition of two successive n-bit numbers, by means of the reset line.

The bit-serial subtractor element can be realized similarly. The only difference is that instead of an adder 62, a subtractor is employed. Furthermore, the delay element 61 is set to the value 1 between the subtraction of two successive n-bit numbers.

The figures and the description relating to them are only intended to illustrate the present invention. In their details, the methods and filter of the invention can vary within the purview of the accompanying claims.

We claim:

1. A method to multiply a binary number by a fractional coefficient comprising the steps of:

decomposing said fractional coefficient into a plurality of sums of fractional binary numbers;

receiving and retaining said binary number;

selecting binary digit locations of the retained binary number representing a multiplication of said binary number by each of the fractional binary numbers;

arithmetically combining the contents of the binary digit locations to form a single binary digit of a result of the multiplication;

transferring said single binary digit for further processing;

shifting said binary number one binary digit location toward a least significant bit of said binary number; and repetitively arithmetically combining said binary digit locations, transferring said single binary digit of the result, and shifting said binary number until all digit locations have been shifted toward the least significant digit.

2. The method of claim 1 wherein said arithmetic is selected from a group of arithmetic combinings consisting of bit-serial adding and bit serial subtracting of the contents of said binary locations.

3. The method of claim 1 wherein the binary number is bit-serially received for the receiving and retaining.

4. The method of claim 1 wherein a subsequent binary number is bit-serially received simultaneously to the retaining and multiplying of said binary number.

5. A multiplication apparatus to multiply a binary number by a fractional coefficient comprising:

a receiving and retention means to acquire and retain said binary number;

a shifting means connected to receiving and retention means to shift said binary number bit-wise toward a least significant bit;

a decomposing means to determine a sum of a plurality of fractional binary numbers that constitute said fractional coefficient;

a binary digit selector to select binary digit locations of the binary number from said shifting means, whereby said selected binary digit locations represent fractional binary numbers;

a combining means connected to the binary digit selector to arithmetically combine the contents of the binary digit locations from binary digit selector to form a single binary digit of a result of said multiplication; and a transferring means connected to the combining means and the shifting means to transfer said single binary digit of the result for further processing and to cause said shifting means to shift said binary number by one binary digit to generate each successive digit of said result.

6. The apparatus of claim 5 wherein said combining means performs bit-serial addition and bit-serial subtraction of said binary digits.

7. The apparatus of claim 5 wherein the binary number is transferred bit-serially to said receiving and retention means.

8. The apparatus of claim 5 wherein a subsequent binary number is transferred bit-serially to said receiving and retention means simultaneously with the generation of the result of said multiplication.

9. A multiply/accumulate apparatus to perform a matrix multiplication of a matrix of binary numbers with a vector of fractional coefficients comprising:

a multiplication unit that comprises:

a receiving and retention means to acquire and retain one of said binary numbers, a shifting means connected to receiving and retention means to shift said binary number bit-wise toward a least significant bit, a decomposing means to determine a sum of a plurality of fractional binary numbers that constitute said fractional coefficient, a binary digit selector to select binary digit locations of the binary number from said shifting means, whereby said selected binary digit locations represent fractional binary numbers, a combining means connected to the binary digit selector to arithmetically combine the contents of the binary digit locations from binary digit selector to form a single binary digit of a result of said multiplication, and a transferring means connected to the combining means and the shifting means to transfer said single binary digit of the result for further processing and to cause said shifting means to shift said binary number by one binary digit to generate each successive digit of said result.

10. The multiply/accumulate apparatus of claim 9 further comprising:

an accumulator to combine sequential results of the multiplier to form a resulting vector.

11. The multiply/accumulate apparatus of claim 9 wherein said combining means performs bit-serial addition and bit-serial subtraction of said binary digits.

12. The multiply/accumulate apparatus of claim 9 wherein the binary number is transferred bit-serially to said receiving and retention means.

13. The multiply/accumulate apparatus of claim 9 wherein a subsequent binary number of the matrix of binary numbers is transferred bit-serially to said receiving and retention means simultaneously with the generation of the result of said multiplication.

* * * * *